US008566998B2

(12) United States Patent
Gavney, Jr. et al.

(10) Patent No.: US 8,566,998 B2
(45) Date of Patent: Oct. 29, 2013

(54) ABSORBENT STRUCTURES WITH INTEGRATED CONTACT ELEMENTS

(76) Inventors: James A. Gavney, Jr., Palo Alto, CA (US); Jerry Mix, Redwood City, CA (US)

( * ) Notice: Subject to any disclaimer, the term of this patent is extended or adjusted under 35 U.S.C. 154(b) by 0 days.

(21) Appl. No.: 13/385,501

(22) Filed: Feb. 23, 2012

(65) Prior Publication Data

US 2012/0151699 A1    Jun. 21, 2012

Related U.S. Application Data

(63) Continuation of application No. 11/122,684, filed on May 4, 2005, now Pat. No. 8,141,194, which is a continuation-in-part of application No. 10/705,150, filed on Nov. 10, 2003, now abandoned.

(60) Provisional application No. 60/424,855, filed on Nov. 9, 2002, provisional application No. 60/424,856, filed on Nov. 9, 2002.

(51) Int. Cl.
*A47L 1/06* (2006.01)

(52) U.S. Cl.
USPC ............... 15/121; 15/118; 15/114; 15/245

(58) Field of Classification Search
USPC ............. 15/110, 118, 121, 244.1, 244.3, 245, 15/114, 117
See application file for complete search history.

(56) References Cited

U.S. PATENT DOCUMENTS

| 2,678,458 | A | * | 5/1954 | Vosbikian et al. | 15/116.2 |
| 2,679,063 | A | * | 5/1954 | Hoffmann | 15/186 |
| 5,429,678 | A | * | 7/1995 | Fany | 134/6 |
| 6,094,766 | A | * | 8/2000 | Nash et al. | 15/104.93 |
| 6,289,547 | B1 | * | 9/2001 | Narula et al. | 15/167.3 |
| 7,311,591 | B2 | * | 12/2007 | Stubbs | 451/538 |
| 7,788,757 | B2 | * | 9/2010 | Lei | 15/28 |

FOREIGN PATENT DOCUMENTS

| FR | 2793136 A1 | * | 11/2000 |
| JP | 06098847 A | * | 4/1994 |

* cited by examiner

*Primary Examiner* — Shay Karls

(74) *Attorney, Agent, or Firm* — James A. Gavney, Jr.; JAG Patent Serv.

(57) ABSTRACT

A device comprising an absorbent structure and one or more resilient contact elements integrated into the absorbent structure is disclosed. The absorbent structure is preferably a sponge or foam structure and the resilient contact elements are squeegees, nodules, or combinations thereof. In accordance with an embodiment of the invention, the resilient contact elements include anchor features that are embedded within the absorbent stricture.

13 Claims, 14 Drawing Sheets

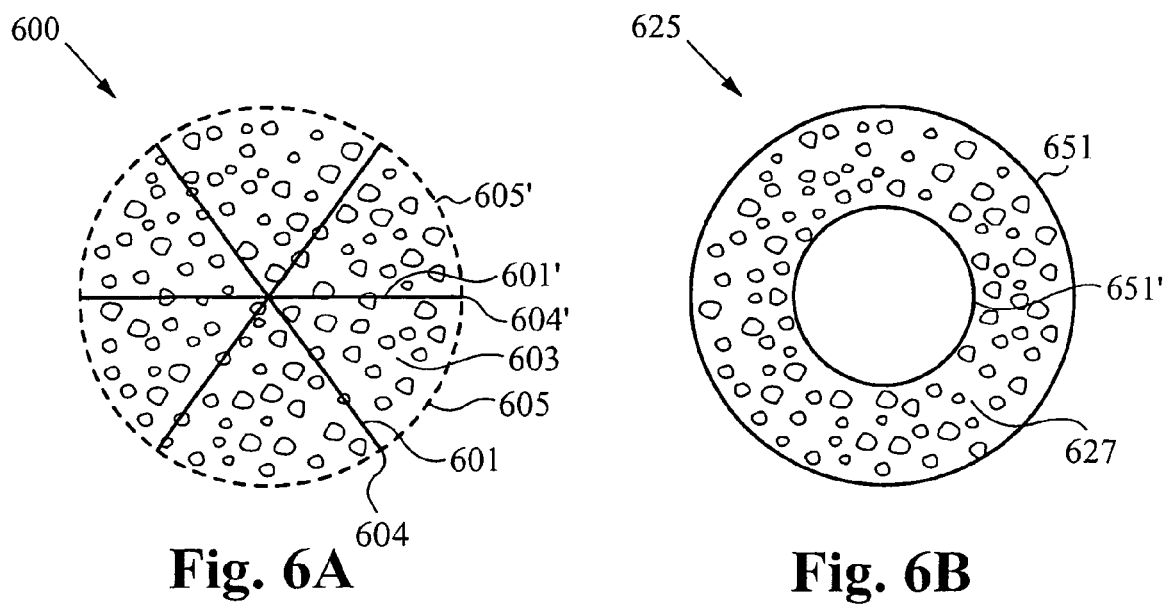
Fig. 6A  Fig. 6B
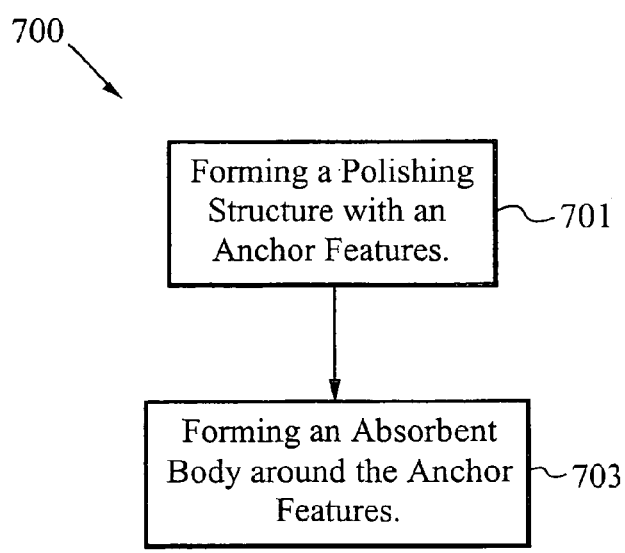
Fig. 7

ABSORBENT STRUCTURES WITH INTEGRATED CONTACT ELEMENTS

RELATED APPLICATIONS

This Patent application is a Continuation Application of the patent application Ser. No. 11/122,684, filed May 4, 2005 now U.S. Pat. No. 8,141,194, titled ABSORBENT STRUCTURES WITH INTEGRATED CONTACT ELEMENTS, which is a Continuation-in-Part Application of the patent application Ser. No. 10/705,150, filed Nov. 10, 2003 now abandoned, titled SQUEEGEE DEVICE AND SYSTEM". The patent application Ser. No. 10/705,150 filed Nov. 10, 2003, titled SQUEEGEE DEVICE AND SYSTEM" claims priority under 35 U.S.C. 119 (e) of the U.S. Provisional Patent Application Ser. No. 60/424,855, filed Nov. 9, 2002, and titled "SQUEEGEE DEVICE AND SYSTEM" and the Provisional Patent Application Ser. No. 60/424,856, also filed Nov. 9, 2002, and also titled "SQUEEGEE DEVICE AND SYSTEM". The patent application Ser. No. 11/122,684, filed May 4, 2005, titled ABSORBENT STRUCTURES WITH INTEGRATED CONTACT ELEMENTS, the patent application Ser. No. 10/705,150, filed Nov. 10, 2003, titled SQUEEGEE DEVICE AND SYSTEM", the U.S. Provisional Patent Application Ser. No. 60/424,855, filed Nov. 11, 2002, and titled "SQUEEGEE DEVICE AND SYSTEM" and the U.S. Provisional Patent Application Ser. No. 60/424,856, also filed Nov. 9, 2002, and also titled "SQUEEGEE DEVICE AND SYSTEM" are all hereby incorporated by reference.

FIELD OF THE INVENTION

This invention relates generally to applicator devices and applicator systems. More specifically the invention relates to devices and systems with resilient contact elements coupled to absorbent structures for treating surfaces.

BACKGROUND

There are many different devices available for applying materials to surfaces and/or for cleaning the surfaces. Each device is made from materials that have characteristic for a specific application or cleaning process. Brushes are often used for applying materials to surfaces or cleaning surface where scrubbing and low absorption is required. Sponges are often used for cleaning applying materials to surfaces or cleaning surface where low abrasion and a high degree of absorption is required. Scouring pads are used for applying materials to surfaces or cleaning surfaces where a high degree of abrasion is required. Squeegees are typically used to wipe materials form very smooth surfaces, such as window. While there are clearly many options of device for a particular task, many of the devices fall short of an ideal cleaning device.

SUMMARY OF THE INVENTION

In accordance with the embodiments of the invention, a device comprises an absorbent structure and one or more resilient contact elements with anchor structures embedded within the absorbent structure. The absorbent structure can be made from any absorbent or porous and deformable material, but is preferably made from a sponge material, a foam material or a combination thereof. The anchor features are formed from the same material or materials as the resilient contact elements or are formed from a different material. The resilient contact elements are preferably formed from resilient polymeric materials, such as plastic, rubber, polyurethane, rubber or a combination thereof. The resilient contact elements are preferably non-absorbent (i.e. do not readily absorb water). Alternatively, the resilient contact elements are less absorbent and than the absorbent structure. For example, the absorbent structure can be formed form a sponge material or a foam material and the resilient contact elements can be formed from a dense sponge material or foam material with smaller pore sizes, such that water is not readily absorbed by the dense sponge material or foam material. The resilient contact elements can include an abrasive material. Methods and materials for making molded abrasive structures are described in U.S. Pat. No. 6,126,533, and titled "MOLDED ABRASIVE BRUSH", the contents of which are hereby incorporated by reference.

In accordance with the embodiments the invention, the resilient contact elements are squeegees with wiping edges, nodules with wiping tip or a combination thereof. The wiping surfaces (edges or tips) of the resilient contact elements receded below a surface of the absorbent structure, are even or flush with the surface of the absorbent structure, protrude from or extend out from the surface of the absorbent structure or any combination thereof.

The resilient contact elements can be contoured or shaped in any of different ways. For example, walls of squeegee contact elements can be curved and/or tapered and wiping edges of the squeegee contact elements can be contoured to have pointed features, rounded features and/or angled features. Also, walls of nodular contact elements can be contoured or tapered and wiping tips of the nodular contact elements can be contoured to be pointed, rounded and/or angled.

In accordance with further embodiments of the invention, a device comprises an applicator head or cleaning head with an absorbent structure and one or more resilient contact element incorporated or integrated into the absorbent structure, such as described above, and a handle. The device is an oral-care device, a medical device, or any type of cleaning and/or applicator device. The handle can be a manual handle or a motorized handle that is configured to vibrate, oscillate, rotate or otherwise move the applicator head or cleaning head. The handle, whether manual or electric, can be configured to detectably couple to the applicator head or cleaning head.

In still further embodiments of the invention, a device comprises an absorbent structure and one or more resilient contact element incorporated or integrated into the absorbent structure, as described above, and a scouring structure or pad attached a surface of the absorbent structure.

In accordance with the method of the invention, a device is made by forming an extended resilient structure with contact elements and attaching an absorbent material resilient structure. The extended resilient structure can be formed by extruding the extended resilient structure, by embossing the resilient contact elements into a sheet of embossable material or a combination thereof.

Where the extended resilient structure is formed by embossing a sheet of embossable material, a complementary sheet of absorbent material can be glued, laminated or otherwise attached to embossed sheet to form web or roll that can then be converted or cut into smaller units. Where extended resilient structure is formed by an extrusion process, the absorbent structure can be formed around walls and/or anchor features of the extended resilient structure, which can also be converted or cut into smaller units.

BRIEF DESCRIPTION OF FIGURES

FIG. 6A-B show cross sectional views of extended resilient contact structures and with an absorbent material coupled to walls of the extended resilient contact structures, in accordance with embodiments of the invention.

FIG. 7 shows a block diagram outlining the steps for making a device, in accordance with embodiments of the invention.

DETAILED DESCRIPTION OF THE INVENTION

Figure 1A:
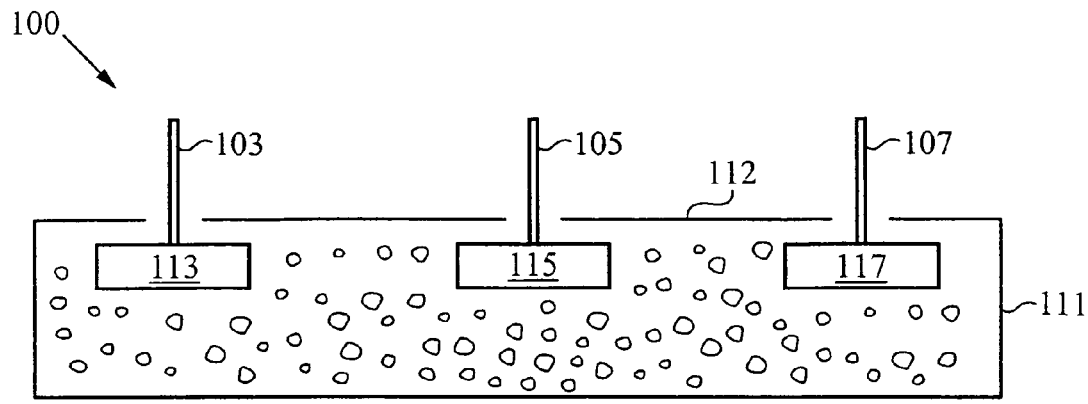
FIG. 1A-C show views of devices with squeegee resilient contact elements with anchor features that are imbedded into an absorbent structure, in accordance with the embodiments of the invention.

FIG. 1A shows a cross-sectional view of a device 100 with a plurality of squeegee elements 103, 105 and 107 that protrude from a surface 112 of an absorbent structure 111. The squeegee elements 103, 105 and 107 are coupled to anchor features 113, 115 and 117, also called boats, that are embedded within the absorbent structure 111 for securing or anchoring the squeegee elements 103, 105 and 107 to the absorbent structure 111.

Figure 1B:
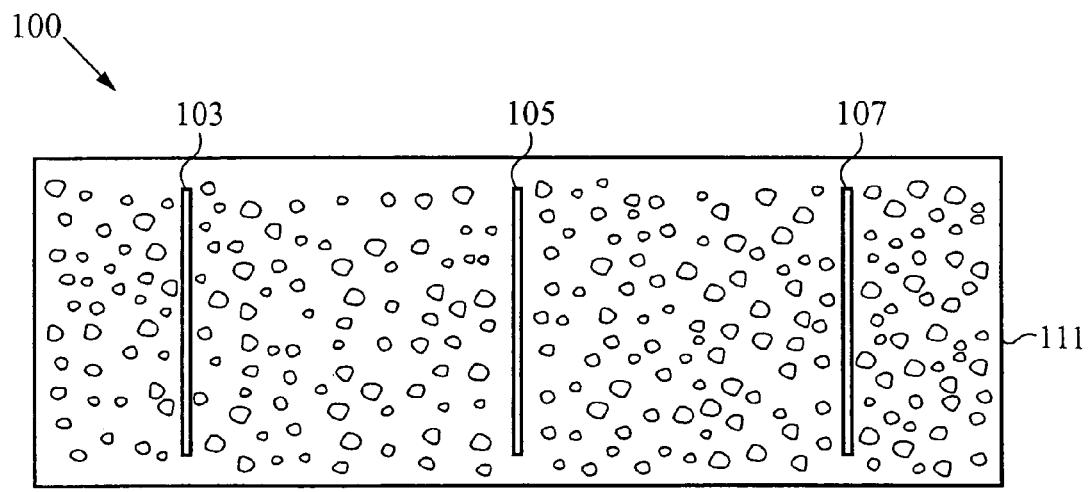

FIG. 1B shows a bottom view of the device 100. The squeegee elements 103, 105 and 107 are shown as being linear, but it will be clear to one skilled in the art from the discussion above and the below that the squeegee elements 103, 105 and 107 can be curved contoured or otherwise shaped.

Figure 1C:
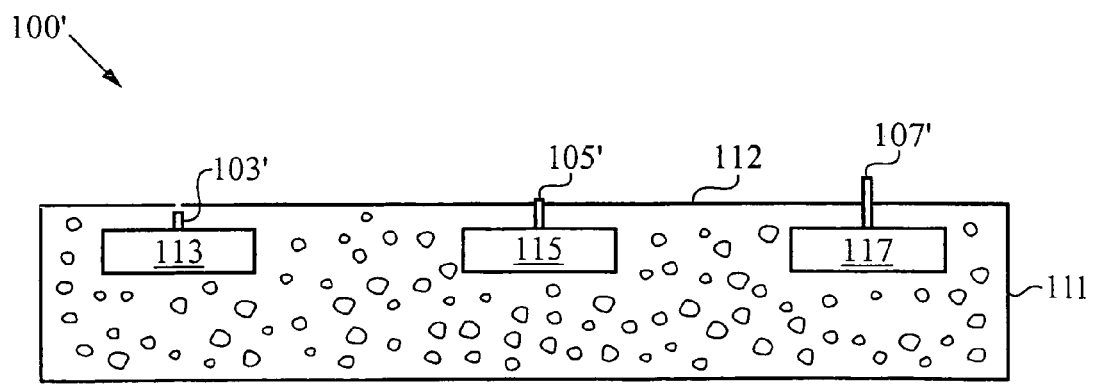

FIG. 1C shows a cross-sectional view of a device 100', in accordance with an alternative embodiments of the invention. The device 100' includes a plurality of squeegee elements 103', 105' and 107' that are coupled to the absorbent structure 111 through anchor features, such as described with reference to FIG. 1A. The squeegee element 103' has a wiping edge that recedes below a surface 112 of the absorbent structure 111 which can be expressed or exposed by pressing in the surface 112 of the absorbent structure 111, such as, for example, during a cleaning operation. The squeegee element 105' is flush or even with the surface 112 of the absorbent structure 111, and the squeegee element 107' protrudes a distance from the surface 112 of absorbent structure 111, such as described with reference to the squeegee elements 103, 105 and 107 in FIG. 1A. In will be clear one skilled in the art that all of the squeegee elements 103', 105' and 107' can recede below the surface 112, be flush or even with the surface 112, protrude any distance or range of distances from the surface 112 or any combination thereof.

Figure 2A:
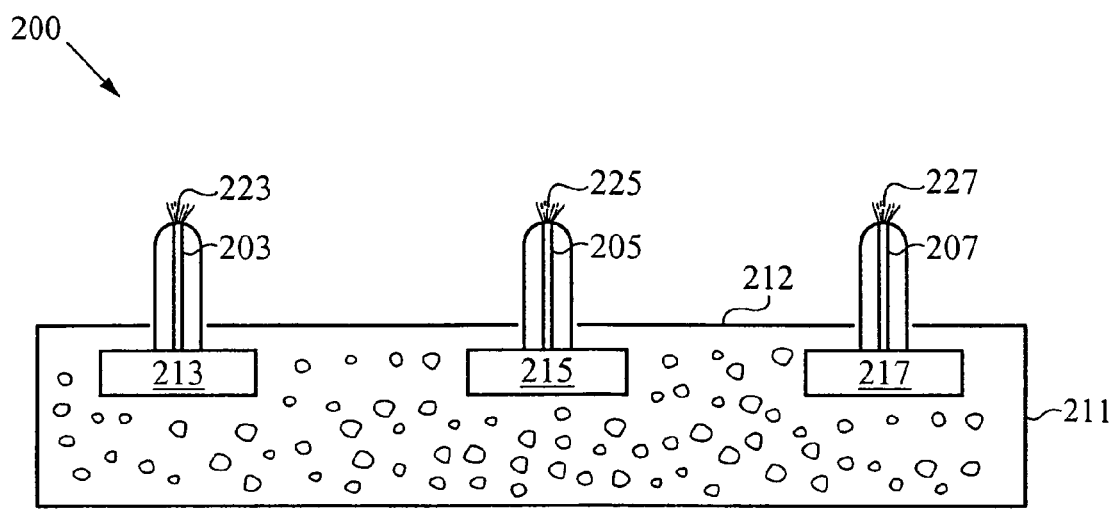
FIG. 2A-B show views of devices with nodule resilient contact elements with anchor features that are imbedded into an absorbent structure, in accordance with the embodiments of the invention.

FIG. 2A shows a cross-sectional view of a device 200 with a plurality of nodule elements 203, 205 and 207 that protrude from a surface 212 of an absorbent structure 211. The nodule elements 203, 205 and 207 are coupled to anchor features or boats 213, 215 and 217 that are embedded within the absorbent structure 211 for securing or anchoring the nodule elements 203, 205 and 207 to the absorbent structure 211. The nodule elements 203, 205 and 207 can include bristle section 223, 225 and 227 protrude from the nodule elements 203, 205 and 207. Details of multi-structural contact elements and their uses are provided in U.S. Pat. No. 6,865,767, titled "DEVICE WITH MULTI-STRUCTURAL CONTACT ELEMENTS," the contents of which is hereby incorporated by reference.

Figure 2B:
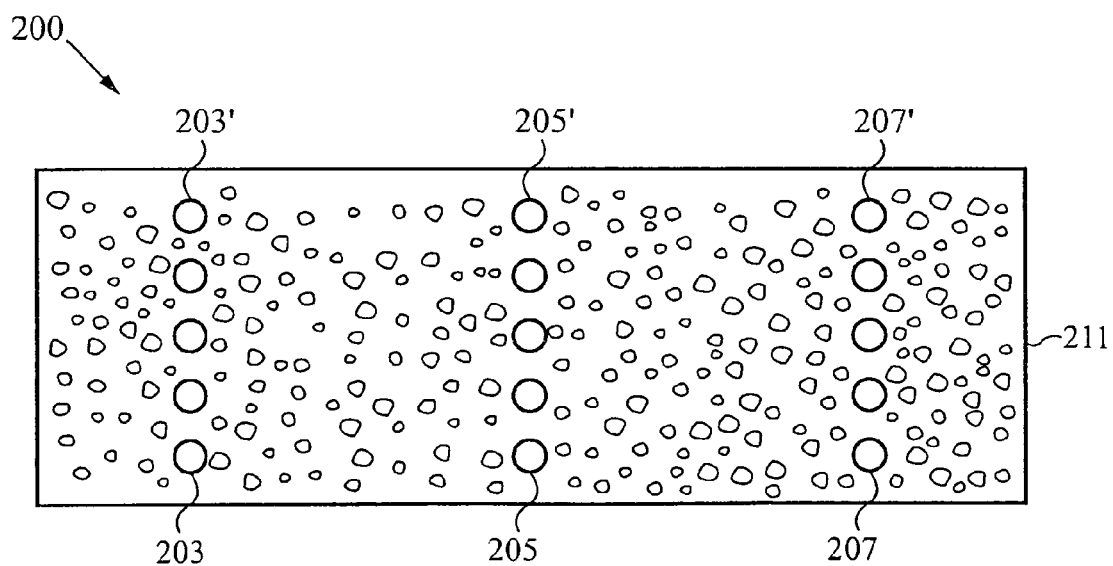

FIG. 2B shows a bottom view of the device 200. The plurality of nodule elements 203, 205, 207, 203', 205 and 207' are shown as being arranged in rows, but it will be clear to one skilled in the art from the discussion above and below that the plurality of nodule elements 203, 205 and 207 and 203', 205 and 207' can be positioned in any geocentric arrangement suitable for the application at hand. It will also be understood that each nodule 203, 205, 207, 203', 205 and 207' or any grouping of the nodules 203, 205, 207, 203', 205 and 207' can have common or separate anchor feature. Further, the plurality of nodule elements 203, 205 and 207 and 203', 205 and 207' can be recessed below the surface 212 of the absorbent structure 211, protrude any distance from the surface 212 of the absorbent structure 211, protrude to any range of distances from the surface 212 of the absorbent structure 211, or any combination thereof.

Figure 3:
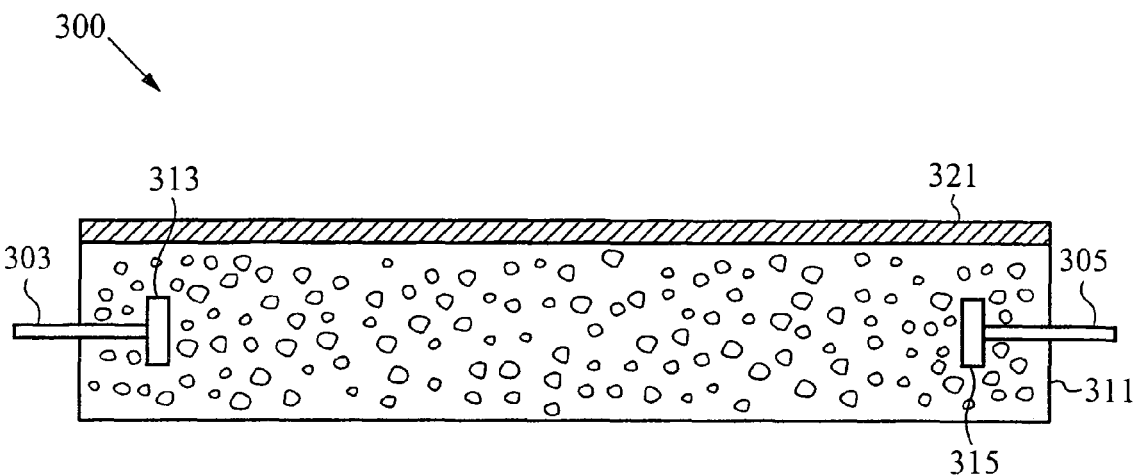
FIG. 3 shows views of a device with resilient contact elements with anchor features that are imbedded into an absorbent structure and an abrasive layer attached to a surface to the absorbent structure, in accordance with the embodiment of the invention.

FIG. 3 shows a cross-sectional view of a device 300 with resilient contact elements 303 and 305 with anchor features 313 and 315 that are imbedded into an absorbent structure 311, as described above. The device 300 also includes an abrasive layer 321 attached to one or more surfaces of the absorbent structure 311.

Figure 4:
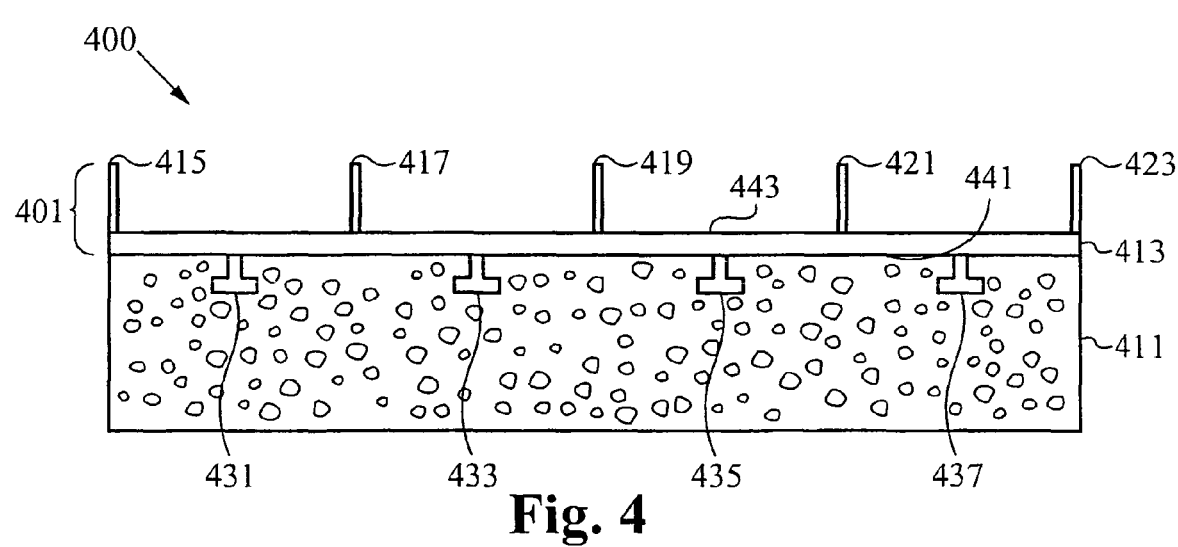
FIG. 4 s shows a cross-sectional view of a device with an extended resilient contact structure with anchor features that are imbedded into an absorbent structure, in accordance with further embodiments of the invention.

FIG. 4 shows a cross-sectional view of a device 400 with an extended resilient contact structure 401. The extended resilient contact structure 401 includes a sheet structure 413 with a plurality of resilient contact elements 415, 417, 419, 421 and 423 protruding from a top surface 433 of the sheet structure 413. The sheet structure 413 also can include a plurality of anchor features 431, 433, 435 and 437 protruding from an inner surface 441 for anchoring the extended resilient contact structure 401 to the absorbent structure 411, such as described previously. Also, the extended resilient contact structure 401 can be fixed to or attached to the absorbent structure 411 in any number of different ways including glues and adhesives.

Figure 5:
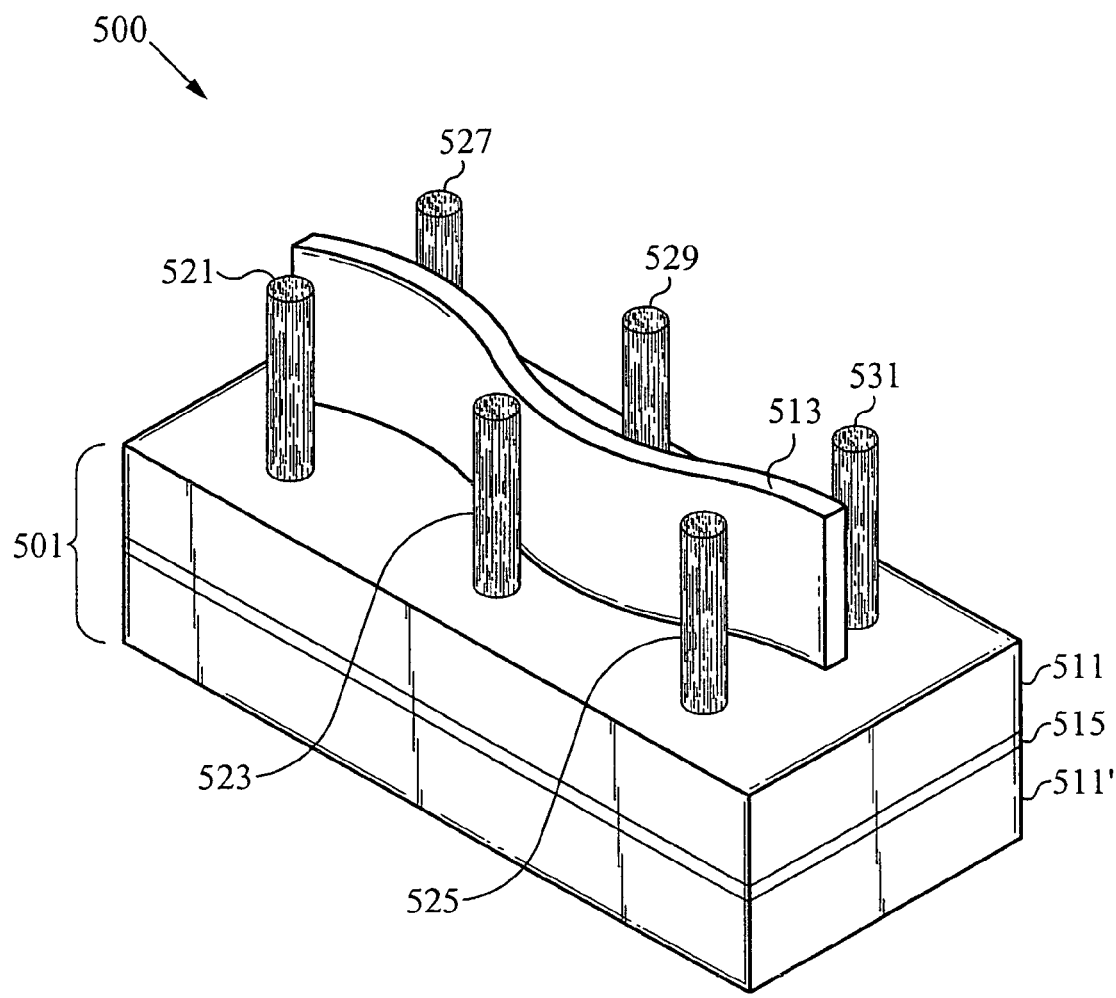
FIG. 5 shows perspective view of the device with a contoured squeegee structure and bristles protruding form an absorbent structure, in accordance with the embodiments of the invention.

FIG. 5 shows perspective view of the device 500 with a contoured or curved squeegee structure 513 protruding from an absorbent structure 501, in accordance with the embodiments of the invention. The contoured or curved squeegee structure 513 is anchored to the absorbent structure 501, through an extended anchor feature 515 that is sandwiched between sections 511 and 511' of the absorbent structure 501. The device 500 can also include any number of bristle sections and/or nodule elements 521, 523, 525, 527, 529 and 531 that are coupled to or anchored to one or more sections 511 and 511' of the absorbent structure 501 through anchor features or boat structures (not shown) or through the extended anchor feature.

FIG. 6A-B show cross sectional views of extended 600 and 625 with absorbent materials coupled to walls of the extended resilient contact structures, in accordance with embodiments of the invention. FIG. 6A shows a cross-sectional view of the extended structure 600 with a plurality of intersecting squeegee sections 601 and 601' with the absorbent material 603 attached to walls of the intersecting squeegee segments 601 and 601' to provides squeegee wiping edges 604 and 604' and absorbent wiping surfaces 605 and 605'. FIG. 6B shows a cross-sectional view of the extended structure 650 that has tubular-shaped squeegee 651 and 651' and the absorbent material attached to or sandwiched between walls of the tubular-shaped squeegees 651 and 651'. The squeegees of the extended structures 600 and 650 can be readily extruded and the absorbent materials can then be blown or otherwise formed between the squeegee walls. After the extend structures 600 and 650 are formed, the extend structures 600 and 650 can be converted or cut into smaller units and packaged.

FIG. 7 shows a block diagram 700 outlining steps for making a device, in accordance with embodiments of the invention. In the step 701 a polishing structure comprising resilient wiping or contact elements, such as squeegees, nodules or a combination thereof and anchor features is formed. After the polishing structure is formed in the step 701, in the step 703 an absorbent structure is formed around the anchor features, such that anchor features are imbedded in the absorbent structure and the polishing structure is secured to the absorbent structure.

Figure 8:
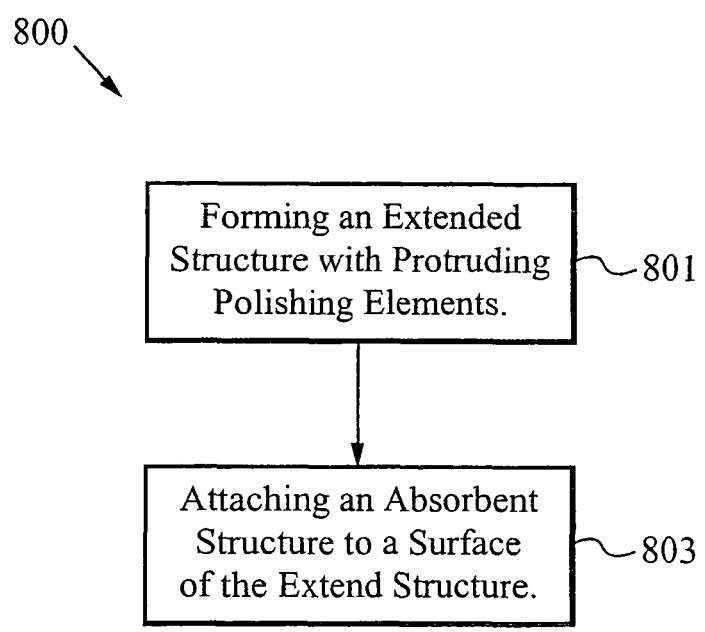
FIG. 8 shows a block diagram outlining the steps for making a device, in accordance further embodiments of the invention.

FIG. 8 shows a block 800 diagram outlining steps for making a device, in accordance further embodiments of the invention. In the step 80 an extended structure is formed that includes a plurality of protruding polishing or resilient contact elements. After the extended structure is formed in the step 801, in the step 803 an absorbent structure is attached to one or more surfaces of the extended structure. The extended structure can include anchor features that are embedded in the absorbent structure. Also the extended structure can be formed in sheets that are glued or otherwise attached to the absorbent structure, extruded with the absorbent material formed between walls of the extended structure, such as described previously with reference to FIGS. 6A-B, or any combination thereof.

Figure 9:
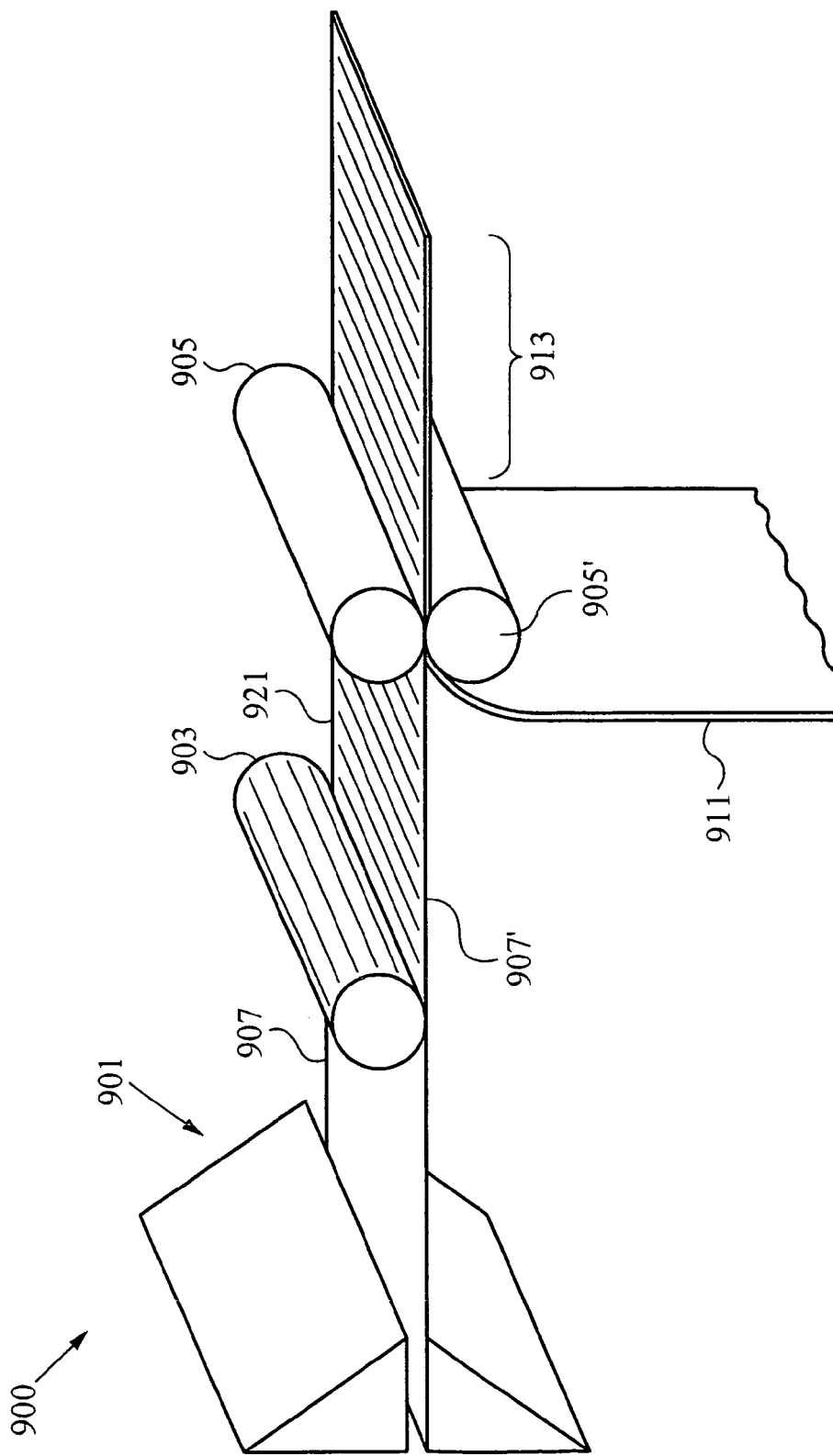
FIG. 9 shows a system for making an extended resilient structure and attaching absorbent layer to a surface of the extended resilient structure, in accordance with the method of the invention.

FIG. 9 shows a system 900 for making an extended resilient structure 907' and attaching absorbent material 911 to a surface of the extended resilient structure 907', in accordance with the method of the invention. The system 900 can include an extruder or heater 901 for forming or treating a sheet of resilient material 907. After the sheet of resilient material 907 is formed or treated, the sheet of resilient material 907 is patterned using any suitable patterning process to form a patterned surface 921 with resilient contact elements. For example, the sheet of resilient material 907 is embossed using an embossing roller 903 to form the extended resilient structure 907' with the patterned surface 921. A layer or absorbent material 911 is then attached to the extend resilient structure 907' by any suitable process, such as an adhesive process using rollers 905 and 905' to form the extended structure 913 that includes a layer of the extended resilient structure 907' and a layer of the absorbent structure 911. The extend structure 913 can then be converted or cut into smaller units and packaged. As described above, and alternatively gluing the absorbent layer 911 onto the extended resilient structure 907', the absorbent layer 911 can be formed directly on a surface of the extended resilient structure 907', which can include anchor features (not shown).

Figure 10:
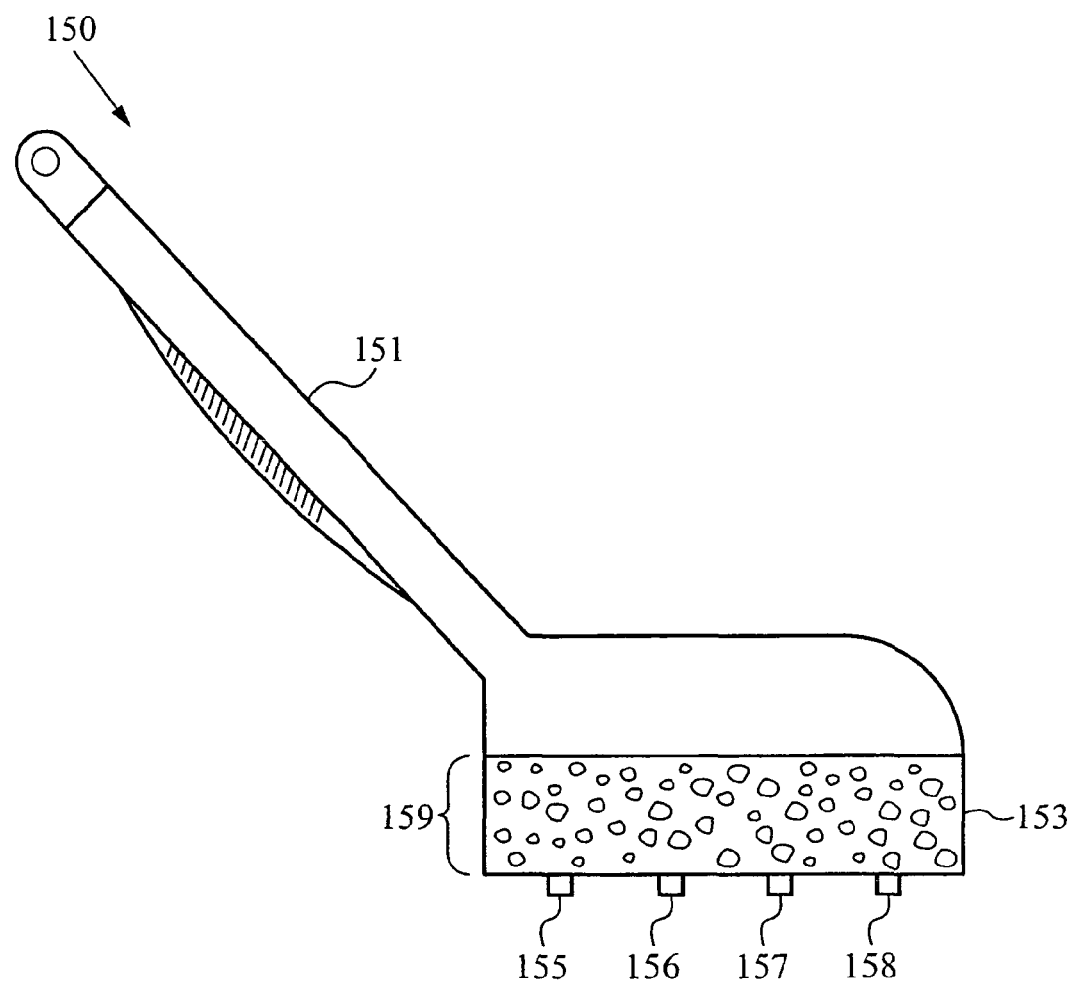
FIG. 10 shows a manual scrubber with resilient contact elements integrated into an absorbent structure, in accordance with the embodiments of the invention.

FIG. 10 shows a scrubber device 150 with a applicator head 159. The applicator head 159 includes resilient contact elements 155, 156, 157 and 158 that are integrated into an absorbent structure 153, such a described above. The resilient contact elements 155, 156, 157 and 158 are squeegee, nodules or any combination thereof. The resilient contact elements 155, 156, 157 and 158 are integrated into the absorbent structure 152 using any one or more of the method described above. The scrubber device 150 can include a handle section 151 that is configured to detachably couple to the applicator head 159, such that the applicator head 159 can be readily replaced and the handle 151 can be reused.

Figure 11:
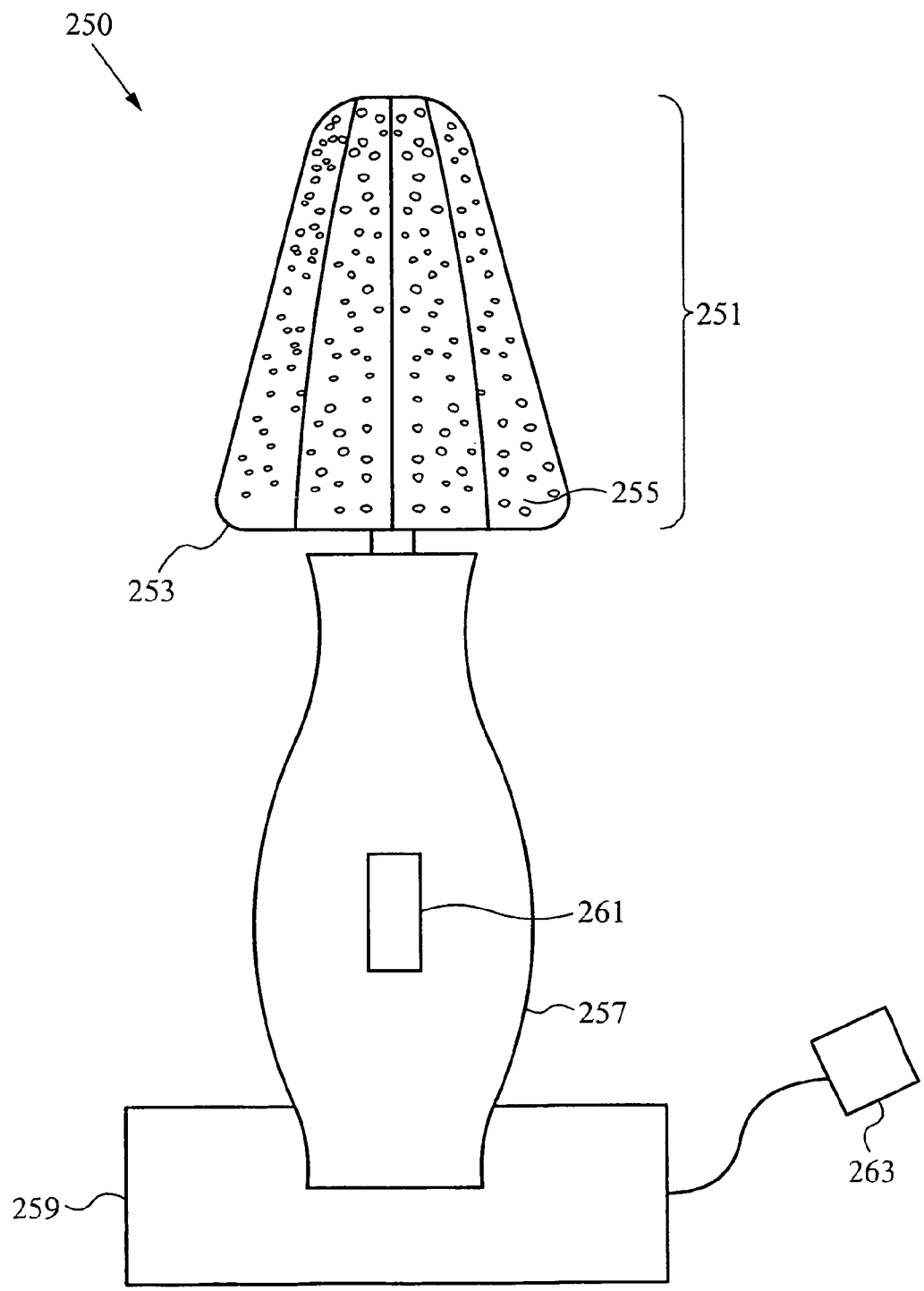
FIG. 11 shows a electric scrubbier with resilient contact elements integrated with absorbent structures, in accordance with the embodiments of the invention.

FIG. 11 shows a electric scrubbier 250 with a power head 251 that spins, oscillates or otherwise moves. The power head 251 includes resilient contact elements 253 integrated with absorbent structures 255. The electric scrubber 250 also includes a motorized handle 257 that can be configured to detachably couple to the power head 251. The motorized handle 257 can include a switch for adjusting and/or initiating movement of the power head 251. The electric scrubber 250 can also include a recharging cradle or stand that couples to a power source 263 for recharging a battery (not show) contained within the motorized handle 257.

Figure 12:
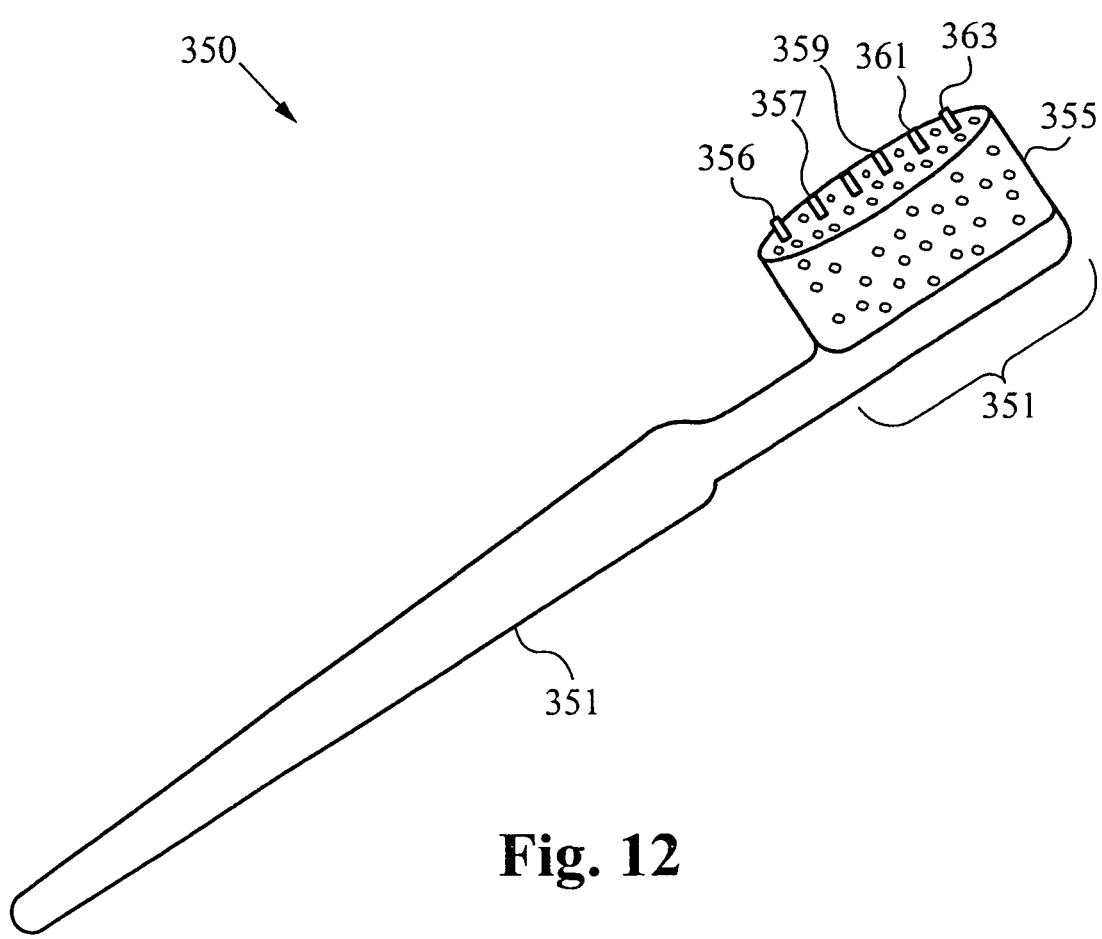
FIG. 12 shows a manual toothbrush, in accordance with the embodiments of the invention.

FIG. 12 shows a manual toothbrush 350 that includes an applicator head 351 with a plurality of resilient contact elements 356, 357, 369, 361 and 363 integrated into an absorbent structure 355, in accordance with the embodiments of the invention. The applicator head 351 is preferably coupled to a handle 351, which can be made to detachably couple to the applicator head.

Figure 13:
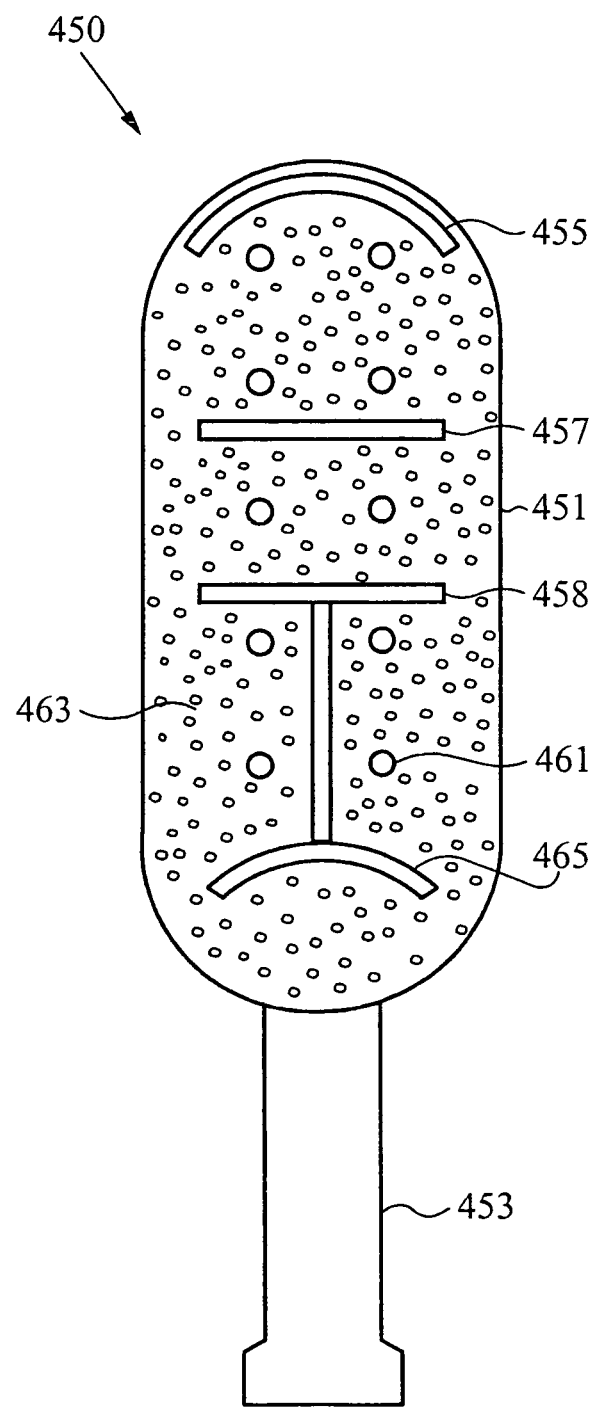
FIG. 13 shows a detachable applicator head, in accordance with the embodiments of the invention.

FIG. 13 shows detachable applicator head 450, in accordance with the embodiments of the invention. The applicator head 450 includes one or more curved squeegees 455 and 465, linear squeegees 457 and 458 or any combination thereof. The applicator head 450 can also include nodules and/or bristle sections 461. The squeegees 455, 456, 457, 458 and the nodules or bristle sections 461 can be integrated with an absorbent structure 463 through one or more anchor features such as described above. The applicator head 450 can also include a neck or shaft 453 configured to detachably couple to a manual handle, a motorized handle and/or a liquid or solution source (not shown). The neck or shaft 453 can be hollow such that a liquid or solution from the liquid or solution source can flow to the absorbent structure 451 through the neck or shaft 453, where the liquid or solution can be applied to a surface.

Figure 14:
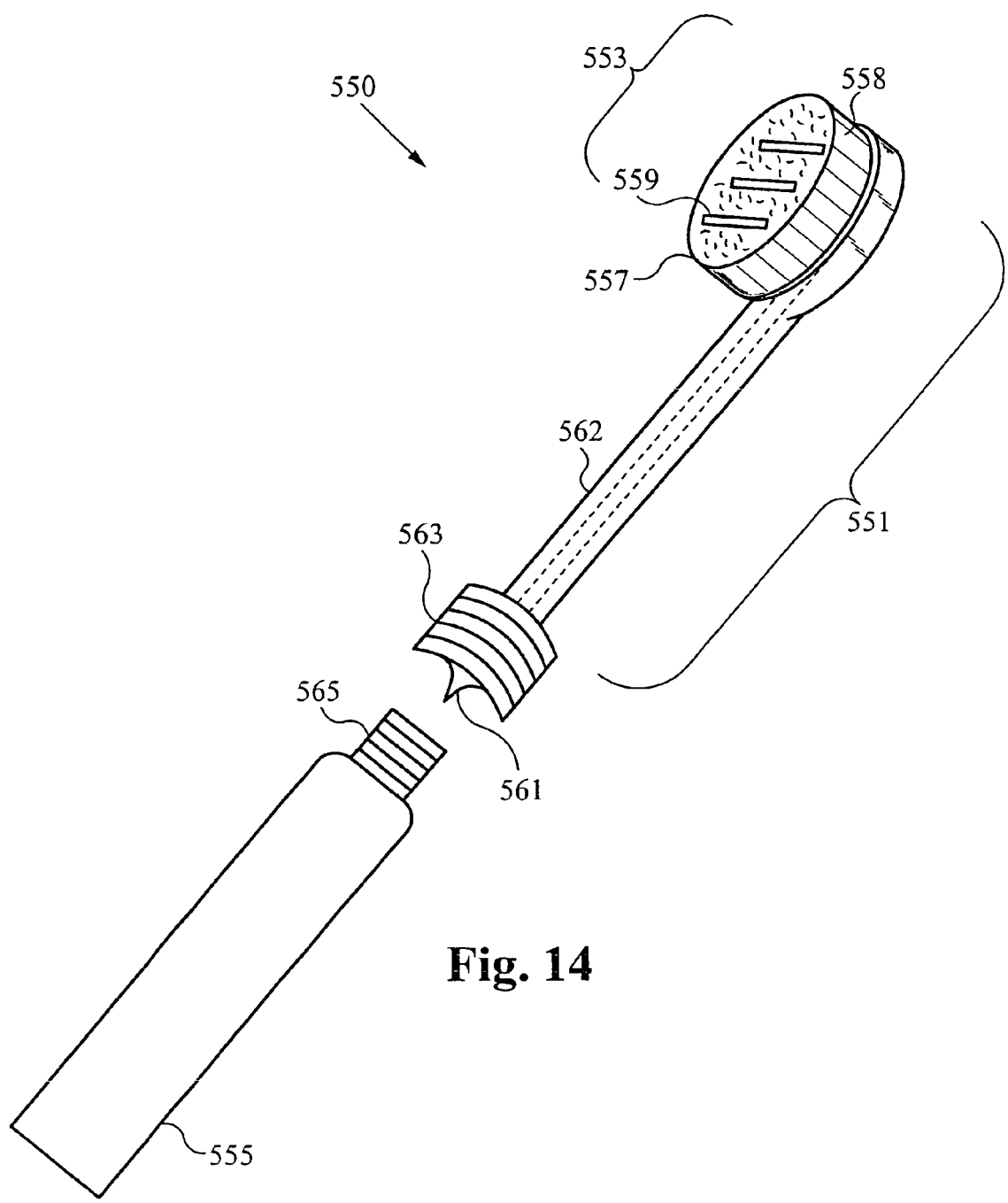
FIG. 14 shows applicator system with a detachable head, in accordance with the embodiments of the invention.

FIG. 14 shows applicator system 550 with a detachable head section 551, in accordance with the embodiments of the invention. The detachable head section 551 includes an applicator portion 553 with an absorbent structure 557 and one or more resilient contact elements 559 integrated into the absorbent structure 557. The applicator portion 553 can also include squeegee or other non-absorbent structure 558 surrounding the absorbent structure 557.

Still refereeing to FIG. 14, the detachable head section 551 include a hollow shaft 562 for feeding for allowing a fluid or solution to flow to the applicator portion 553. The hollow shaft portion 562 includes an attachment feature 563 for coupling to a container 555 with a complementary attachment feature 565. The attachment feature 563 can include a pointed structure 561 for puncturing a foil cover seal on the complementary attachment feature 565, when the detachable head section 551 is coupled to the container 555 through the attachments feature 563 and the complementary attachment feature 565. In use, the detachable head section 551 and the container 555 are coupled together through the attachment feature 563 and the complementary attachment feature 565. A fluid or solution in the container 555 flows through the hollow shaft 562 and is distributed to absorbent structure 557. The applicator section 553 can them be used to apply the fluid or solution to a surface, such a teeth or gums.

Figure 15:
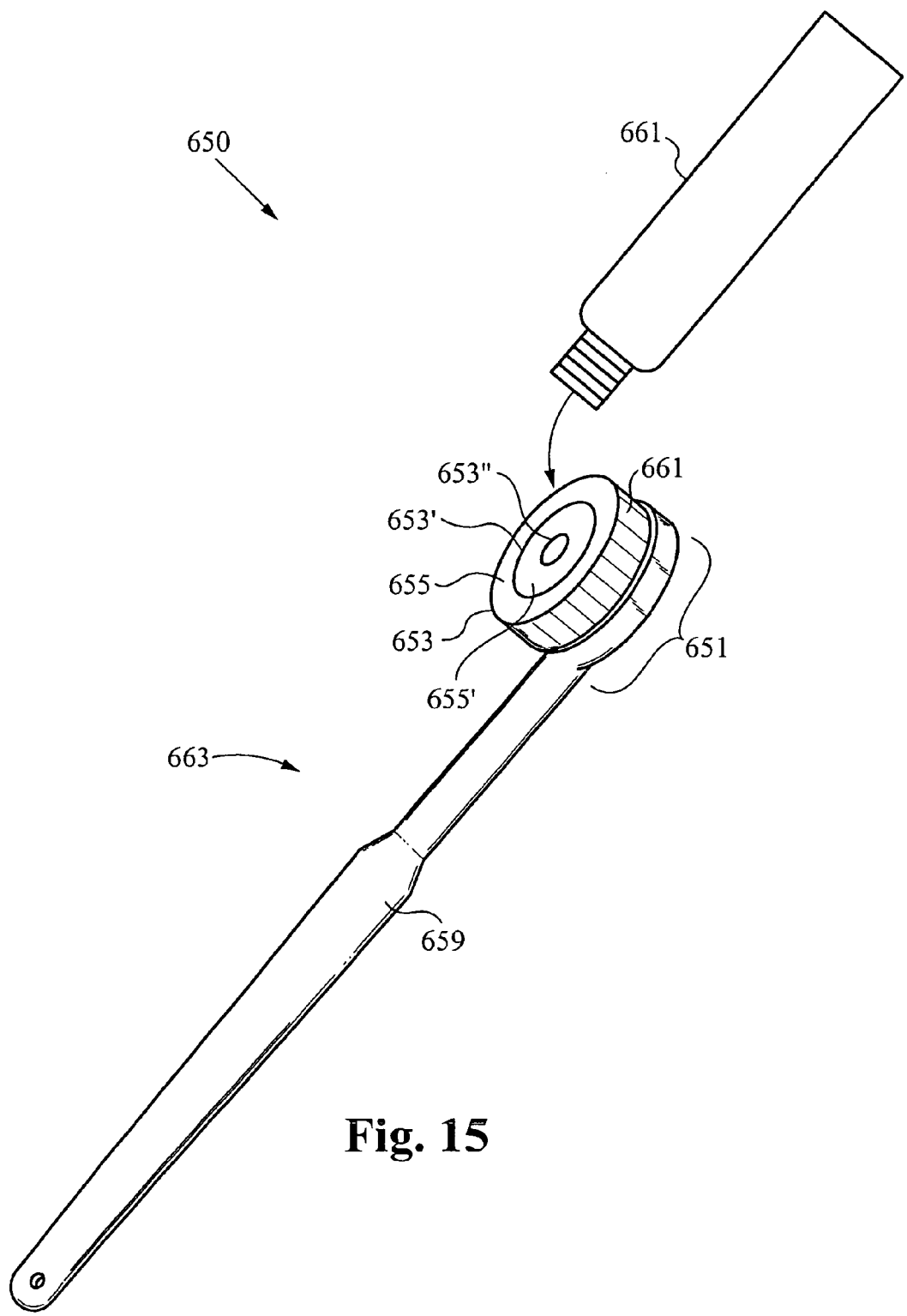
FIG. 15 shows an applicator system; in accordance with further embodiments of the invention.

FIG. 15 shows an applicator system 650, in accordance with further embodiments of the invention. The system includes a manual applicator 663 and a container 661 of a liquid or solution. The manual applicator 663 includes applicator head 651 that is attached to a handle 659. The applicator head 651 includes regions of an absorbent material 655 and 655' and regions of a non-absorbent material or less absorbent material 653, 653' and 653". The wall 661 of the applicator head 651 is preferably also non-absorbent or a less absorbent that the regions of the absorbent material 655 and 655'. In use the liquid or solution from the container 661 is poured or otherwise dispensed onto the applicator head 651 where the liquid or solution is absorbed or partially absorbed into the regions of absorbent material 655 and 655'. The manual applicator 663 can then be used to apply the liquid or solution to a surface, such as teeth and gums.

Figure 16:
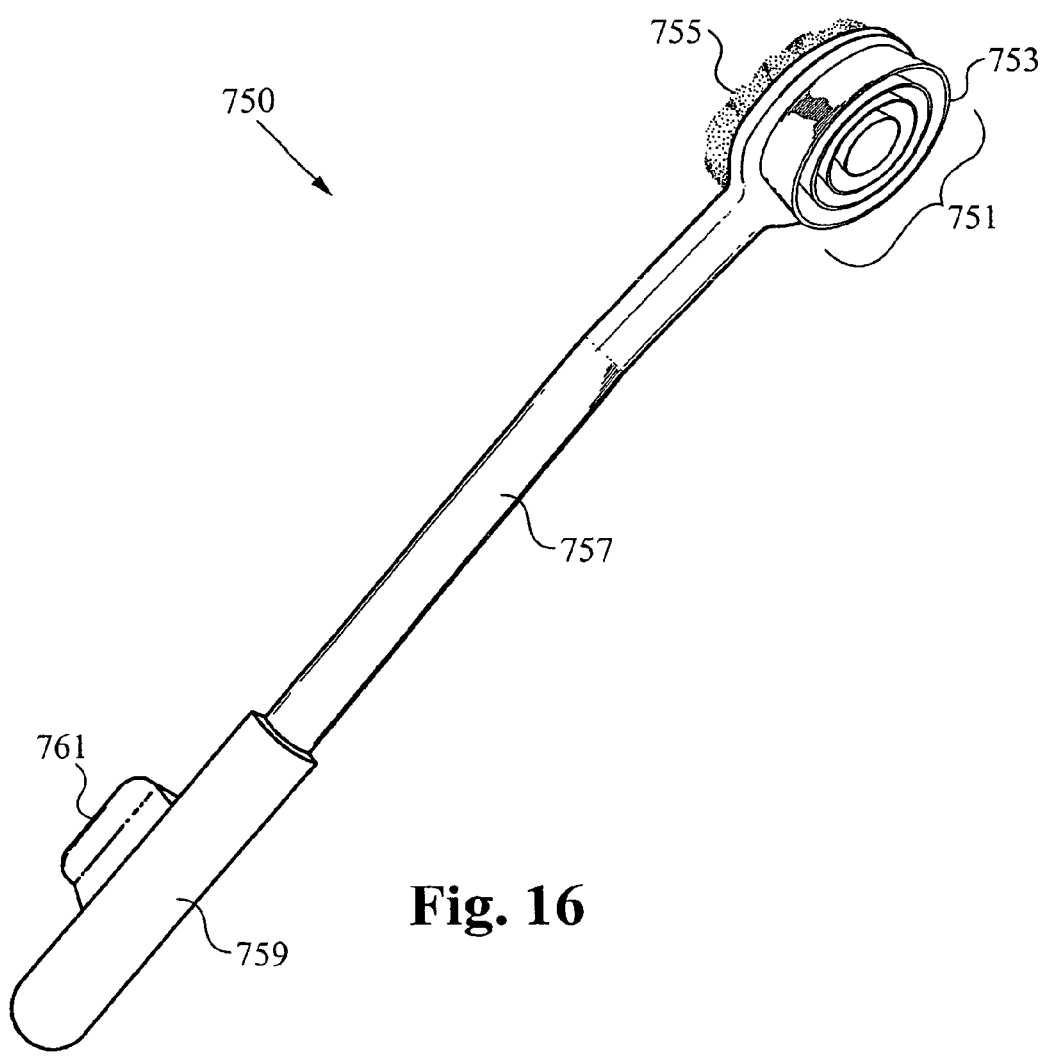
FIG. 16 shows an applicator system, in accordance with yet further embodiments of the invention.

FIG. 16 shows an applicator system 750, in accordance with yet further embodiments of the invention. The applicator system 750 includes an applicator head 751 that is attached to a handle section 757. The applicator head 751 includes a squeegee section 753 and a sponge section 755. The handle section 757 includes a container section 759 for holding a liquid or solution. The handle section 757 is hollow such that the liquid or solution can flow from the container 759 to the applicator head 751. The container section has a release mechanism 761 that can be actuated to initiate a flow of the liquid or solution from the container section 759 to the applicator head 751. The release mechanism 761 can be configured to controllably distribute the fluid or solution to the applicator head. After the fluid or solution is dispensed to the applicator head 751, the applicator system 750 can be used to apply the liquid or solution to a surface, such as teeth or gums.

It will be clear to one skilled in the art from the description above that resilient contact elements described can be contoured, to corrugated, curved, pointed, angled, tapered or otherwise textured. Devices and system in addition resilient contact elements and absorbent structure can also include bristles. Further, any number of the features described above can be combined in different ways to provide other applicator configurations that are considered to be within the scope of the invention. It is also understood that an abrasive material can be integrated into the resilient contact elements. Further, the absorbent structures utilized in the applicators configurations of the present invention can be formed from systematic materials, such as polyurethane, plastics, rubber other polymeric materials, natural materials, such as natural sponge, woven materials, such as cotton and/or other woven materials. The scouring or abrasive elements utilized in the squeegee configuration can be formed from metal, plastic, composite materials or any combination thereof. Accordingly, the proceeding preferred embodiments of the invention is set forth without any loss of generality to, and without imposing limitations upon, the claimed invention.

What is claimed is:

1. A device comprising: a) an absorbent structure; and b) a resilient contact element attached to the absorbent structure, wherein the resilient contact element includes squeegees with elongated walls that intersect and that form intersecting elongated top wiping edges.

2. The device of claim 1, further comprising one or more nodules.

3. The device of claim 2, wherein the one or more nodules include bristles.

4. The device of claim 1, wherein the absorbent structure includes one or more of a sponge or foam material.

5. The device of claim 1, further comprising a handle.

6. The device of claim 5, wherein the handle is motorized.

7. The device of claim 1, further comprising an abrasive layer attached to a surface of the absorbent structure.

8. A device comprising: a) an absorbent structure; and b) a wiping structure with a plurality of resilient contact elements and one or more anchor structures embedded within the absorbent structure, wherein the plurality of resilient contact elements include squeegees with intersecting elongated walls that form an intersecting elongated top wiping edges.

9. The device of claim 8, wherein plurality of resilient contact elements further include one or more nodules with wiping tips.

10. A device comprising: a) an extended structure with resilient contact elements protruding from a first surface of the extended structure, wherein the resilient contact elements include intersecting squeegees; and b) an absorbent structure attached to a second and opposed surface of the extended structure.

11. The device of claim 10, wherein the extended structure includes anchor features protruding from the second and opposed surface that are embedded within the absorbent structure.

12. The device of claim 10, wherein the resilient contact elements include a nodule structure with a wiping tip.

13. The device of claim 10, further comprising an abrasive layer attached to a surface of the absorbent structure.

* * * * *